(12) United States Patent
Ishimine et al.

(10) Patent No.: US 7,428,154 B2
(45) Date of Patent: Sep. 23, 2008

(54) PACKAGE STRUCTURE, PRINTED CIRCUIT BOARD MOUNTED WITH THE SAME, ELECTRONIC APPARATUS HAVING THE PRINTED CIRCUIT BOARD

(75) Inventors: Junichi Ishimine, Kawasaki (JP); Tsuyoshi So, Kawasaki (JP); Hitoshi Nori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 779 days.

(21) Appl. No.: 10/662,815

(22) Filed: Sep. 16, 2003

(65) Prior Publication Data
US 2004/0084764 A1    May 6, 2004

(30) Foreign Application Priority Data
Sep. 18, 2002   (JP) ............................. 2002-270859
Dec. 24, 2002   (JP) ............................. 2002-371709

(51) Int. Cl.
*H05K 7/20*   (2006.01)
*H01L 23/34*  (2006.01)
*F28F 7/00*   (2006.01)

(52) U.S. Cl. .................. 361/704; 165/80.3; 165/185; 257/719; 361/710; 361/719

(58) Field of Classification Search ......... 361/704–710, 361/719–720; 257/705–706, 712–713, 717–718, 257/726–727; 165/80.3, 185
See application file for complete search history.

(56) References Cited

U.S. PATENT DOCUMENTS

| | | | |
|---|---|---|---|
| 6,198,630 B1 | 3/2001 | Cromwell | |
| 6,282,093 B1 | 8/2001 | Goodwin | |
| 6,449,170 B1 * | 9/2002 | Nguyen et al. | 361/778 |
| 6,459,582 B1 * | 10/2002 | Ali et al. | 361/704 |
| 6,545,879 B1 * | 4/2003 | Goodwin | 361/807 |
| 2002/0030972 A1 | 3/2002 | Ali et al. | |

FOREIGN PATENT DOCUMENTS

| | | |
|---|---|---|
| EP | 0 637 079 A1 | 2/1995 |
| GB | 1031233 | 6/1964 |
| JP | 11-135217 | 5/1999 |
| JP | 11-284097 | 10/1999 |
| JP | 2001-281295 | 10/2001 |

* cited by examiner

*Primary Examiner*—Gregory Thompson
(74) *Attorney, Agent, or Firm*—Westerman, Hattori, Daniels & Adrian, LLP.

(57) ABSTRACT

A package structure to be mounted on was external printed circuit board includes a package board that is mounted with an exoergic circuit element, and a heat sink that radiates heat from the exoergic circuit element, wherein first pressure for connecting the heat sink to the package board is separated from second pressure for compressing the package board against the printed circuit board.

15 Claims, 14 Drawing Sheets

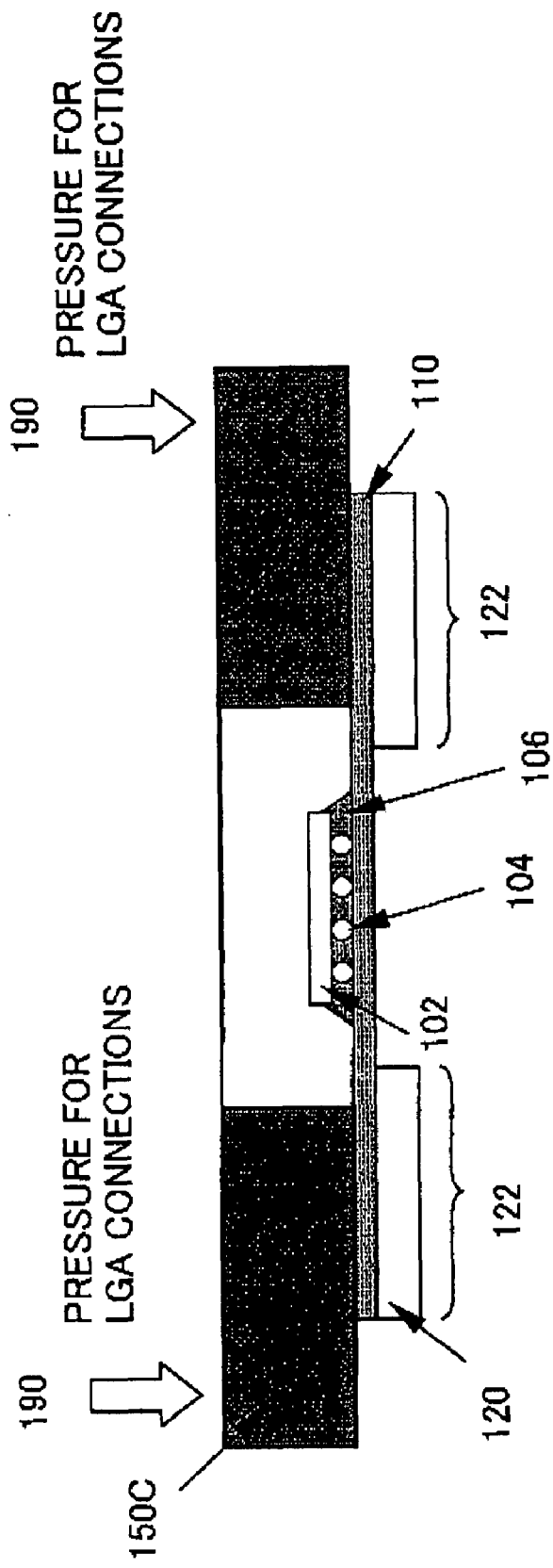

PACKAGE STRUCTURE, PRINTED CIRCUIT BOARD MOUNTED WITH THE SAME, ELECTRONIC APPARATUS HAVING THE PRINTED CIRCUIT BOARD

This application claims a benefit of priority based on Japanese Patent Applications Nos. 2002-371709, filed on Dec. 24, 2002, and 2002-270859, filed on Sep. 18, 2002, each of which is hereby incorporated by reference herein in its entirety as if fully set forth herein.

BACKGROUND OF THE INVENTION

The present invention relates generally to fixture of a board, and more particularly to fixture of a package board having a heat radiator mechanism. The present invention is suitable, for example, for fixture of a beat sink and a Land Grid Array ("LGA") package. The present invention is also relates to a printed circuit board, such as a motherboard, mounted with such a package board, and an electronic apparatus, such as a server, equipped with the printed circuit board.

The recent development of electronic apparatuses has increasingly demanded supply of sophisticated and inexpensive electronic apparatuses. LGA packages have been conventionally proposed for this demand. The LGA package is a type of a package board that uses an LGA socket, instead of soldering, for connection with a printed circuit board (also referred to as a system board or motherboard). Prospective demands for L(3A packages, are expected due to their shorter assembly time and lower cost than Ball Grid Array ("BGA") packages that use soldering for the printed circuit board, since the LGA package includes no soldering step to the printed circuit board, which would otherwise cause thermal breakages of an electronic circuit.

In general, the LGA package is mounted with an IC and an LSI, which serve as a CPU, and the calorific value increases as the CPU improves its performance. Accordingly, a cooling device called a heat sink is thermally connected to the CPU through a heat spreader. The beat sink includes cooling fins adjacent to the CPU, which radiate the heat from the CPU through natural cooling. The conventional LGA package is connected to the printed board through the LGA socket, and clamped by the heat sink.

A description will be given of the conventional fixture of a heat-sink-cum LGA package. Here, FIG. 9 is a schematic sectional view for explaining the conventional fixture of the heat-sink-cum LGA package. As illustrated, a ceramic package board 10 mounted with air LSI 2 via bumps 4 and underfill 6 is mounted onto a printed circuit board 14 via an LGA socket 12, and connected thermally to a beat sink. 18 via a heat spreader 16 The LSI 2 and heat spreader 16 are adhered to each other through adhesives 3. The LGA socket 12 has an LGA terminal section 12a as actual connection part. Pressure member 20 is fixed onto a clamp plate 22 provided on a bottom surface of the printed circuit board 14, through perforations in the heat sink is and the printed circuit board 14. The pressure members 20 compress the heat sink 18 and consequently the heat spreader 16 entirely.

The conventional LGA package thus mounts the LSI 2 onto the ceramic package board 10 so as to prevent the LSI 2 and the board 10 from bending in mounting the LSI 2 because the LSI 2 and ceramic have close coefficients of thermal expansion. Although the underfill 6 directly contacts the package board 10, the underfill 6 has so thin that a difference in coefficient of thermal expansion between the LSI 2 and the package board 10 is prevailing. Use of a material that has a coefficient of thermal expansion close to that of the LSI 2 for the heat spreader 16 to be attached to the rear surface of the LSI 2 would enable the heat spreader 16 to maintain its flatness. Good flatness would reduce influence of pressure from the heat spreader 16 surface on a connection part between the LSI 2 and the package board 10, and a connection part between the LSI 2 and the beat spreader 4. High rigidity of the package board 10 enables the package board 10 to endure an application of the pressure from the top.

In general, the LGA socket 12 makes a terminal section 12a of gummy resin or elastomer blended, with silver flakes at a predetermined density. Silver flakes contact and maintain :good conductivity when this terminal is pressurized. As the applied pressure increases, the contact density of silver flakes increases but the resistance also increases resultantly. It is therefore recommended to adjust applied pressure to target pressure in mounting the LGA package onto the system board for good conductivity without increasing the resistance.

As the above conventional structure has used the package board 10 and the LSI 2 having approximately equal coefficients of thermal expansion, the stress generated with thermal expansion and shrinkage between them becomes very small. No substantial stress causes a breakage between the package board 10 and LSI 2 even when the above pressure is applied due to the similar thermal expansions.

As the necessary pressure to fix the heat sink 18 for the LSI 2 may be smaller than the pressure to ;the terminal section 12a of the LGA socket 12, the pressure applied to the terminal section 12a of the LGA socket 12 also fixes the heat sink 18.

Other prior art disclose, for example, a semiconductor device that includes a printed circuit board, a semiconductor element, a stiffener, and a metal plate, as in Japanese Patent Application Publication No. 11-284097, paragraph Nos. 0024 to 0035, and FIGS. 1 and 2, and a clamp mechanism for applying uniform pressure among a heat sink, an IC, and a socket, as in Japanese Patent Application Publication No. 2001-60778, paragraph Nos. 0006 to 0009, and FIGS. 1A, 1B, 2A and 2B.

Instant inventors have considered use of resin for the package board 10 instead of ceramic for lower cost and easier processing. A resin board is thinner than a ceramic board, and thus expected to exhibit a more improved electric characteristic than the ceramic board.

While the above predetermined pressure is necessary for good conductivity of the LGA terminal section 12a, this pressure causes the stress between the resin package board and the LSI because they have different coefficients of thermal expansion. In other words, as shown in FIG. 9, when the pressure necessary to connect the LGA socket 12 and the printed circuit board 14 to each other is applied between the heat sink 18 and the package board 10, the large force is applied to a connection part between the LSI 2 and the heat spreader 16, and a connection part between the LSI and the resin board, causing cracks in these connection parts. In particular, a coefficient of thermal expansion of the resin board is so different from that of the LSI 2 that the LSI 2 is caused to bend, and the heat spreader 16 adhered to the rear surface of the LSI 2 also bends, as shown in FIG. 10, under influence by bending connection part between the package board 10A and the LSI 2. The large pressure applied to correct this camber is excessive load for the connection part. Here, FIG. 10 is a schematic sectional view for explaining the conventional problem.

BRIEF SUMMARY OF THE INVENTION

Accordingly it is an exemplary object of the present invention to provide a package structure a printed circuit board mounted with this package structure, and an electronic apparatus that includes this printed circuit board, which prevent breakages of a connection part between a resin board and an LSI and/or a connection part between the LSI and a heat sink or heat spreader, and improves reliability,.

In order to achieve these and other objects, a package structure of one aspect according to the present invention to be mounted on an external printed circuit board includes a package board that is mounted with an exoergic, circuit element, and a heat sink that radiates heat from the exoergic circuit element, wherein first pressure for connecting the heat sink to the package board is separated from second pressure for compressing the package board against the printed circuit board. This package structure separates the first pressure from the second pressure, preventing the second pressure from being applied to a connection part between the exoergic circuit element and the package board and a connection part between the exoergic circuit element and the heat sink. In order to protect these connection parts, the first pressure is preferably smaller than the second pressure, for example, set to be about one tenth to about one fifth as large as the second pressure.

A package structure of another aspect according to the present invention to be mounted onto an external printed circuit board includes a package board that is mounted with an exoergic circuit element, a heat sink that radiates heat from the exoergic circuit element, a stiffener located between the heat sink and the package board around the exoergic circuit element, a first pressure mechanism that presses one of the heat sink and the stiffener against the other, and a second pressure mechanism that compresses the stiffener against the printed circuit board. This package structure uses the stiffener to separate the first pressure from the second pressure, and exhibits operations similar to those of the above package structure. Therefore, it is similarly preferable that the first pressure is smaller than the second pressure. When the stiffener is larger than an external form of the package board, the structure becomes simple.

The first and second pressure mechanisms may include two kind of elastic elements, and a coupling member that couples two kind of the elastic elements to each other. For example, the first and second pressure mechanisms are a coil spring and a flat spring, or two coil springs with different shapes, and a bolt that perforates these springs. Use of one coupling member for two elastic members miniaturizes the device for multifunctional purposes.

The package structure further includes a socket, provided on the package board, which electrically connects the package structure to the printed circuit board. The package board in this case serves as an LGA package. In the package structure, the package board may be made of resin. The resin board is less expensive, more sophisticated, and more easily manufactured than the ceramic board, and the inventive structure is particularly suitable in view of a different coefficient of thermal expansion from that of the exoergic circuit element.

The stiffener preferably covers a connection part between the package board and the printed circuit board. Thereby, a connection of the connection part to the printed circuit board may be made firm. Therefore, the stiffener preferably has a certain thickness, rigidity, and strength. The stiffener is made of a highly rigid material, such as stainless. Thereby, the stiffener serves to flatten the package board. The stiffener may be adhered to the package board, thereby preventing a positional offset of the stiffener in carrying the package structure and increasing handling reliability.

The first pressure mechanism may be fixed onto the stiffener. This structure is preferable since the heat sink does not reduce the area of fins and may maintain the predetermined heat radiation efficiency.

The package structure may further include a heat spreader that thermally connects the heat sink to the exoergic circuit element, and has a convex section. A connection of the convex section to the exoergic circuit element separates the peripheral of the exoergic circuit element from the heat spreader above the package board, increasing the degree of freedom of packaging.

The package structure may further include a heat spreader that thermally connects the heat sink to the exoergic circuit element, and is not connected with the package board. Since the heat spreader is not connected to the package board, the force applied to the heat spreader is prevented from being applied to the package board.

The heat sink may be connected to the exoergic circuit element. A direct connection of the heat sink to the exoergic circuit element would reduce more interfaces than a connection to the exoergic circuit element through the heat spreader. Therefore, the heat loss is reduced at the interface and the heat radiation efficiency may be improved.

A package structure of another aspect of the present invention to be mounted on an external printed circuit board includes a resin package board that is mounted with an exoergic circuit element, and a socket, provided onto the package board, which electrically connects the package board to the printed circuit board. This package structure is implemented, for example, as an LGA package including the resin package board. The resin package board is defined to such a board that includes 50% of weight percentage of resin. This package structure has inexpensiveness, economic efficiency, and high performance rather than the conventional ceramic BGA. The package structure preferably further includes a mechanism that applies pressure to connect the socket to the printed circuit board and prevents the pressure from being applied to the exoergic circuit element. This package structure is effective when the heat sink is not provided necessarily. This structure includes, for example, the above stiffener. The pressure that compresses the socket and does no tithe exoergic circuit element may prevent a breakage of the connection part between the exoergic circuit element and the package board.

A printed circuit board having the above package structure and an electronic apparatus having this printed circuit board would constitute another aspect of the present invention.

Other objects and further features of the present invention will become readily apparent from the following description of the embodiments with reference to accompanying drawings.

BRIEF DESCRIPTION OF THE DRAWINGS

FIG. 5 is a schematic sectional view showing a relationship between a stiffener and LGA socket in the package module shown in FIG. 2.

DETAILED DESCRIPTION OF THE INVENTION

Figure 1:
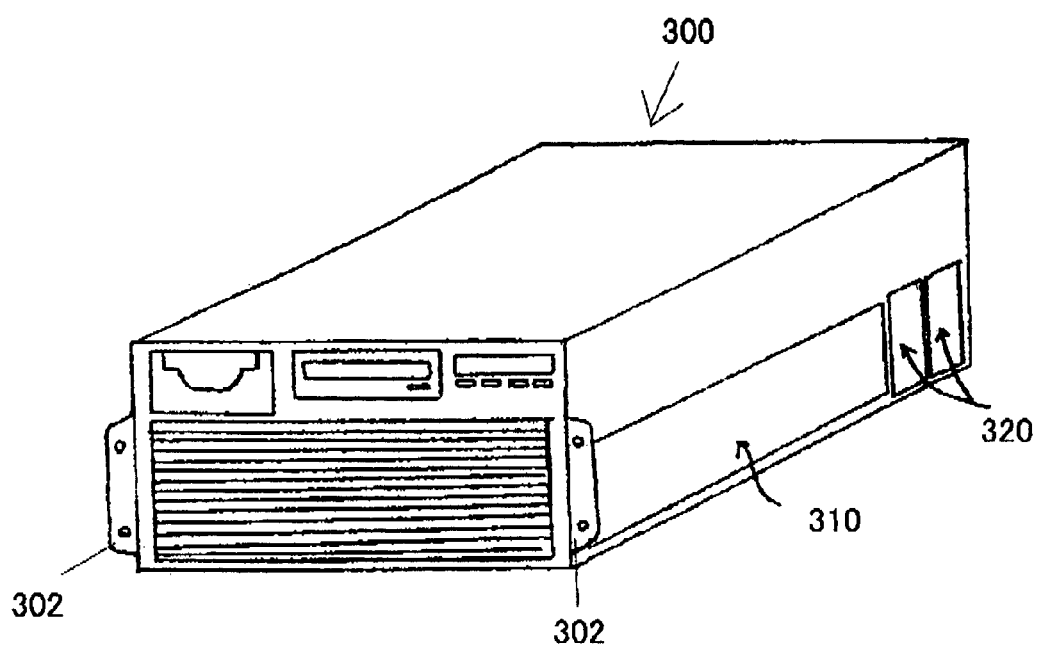
FIG. 1 is a schematic perspective view of an electronic apparatus according to the present invention.
Figure 2:
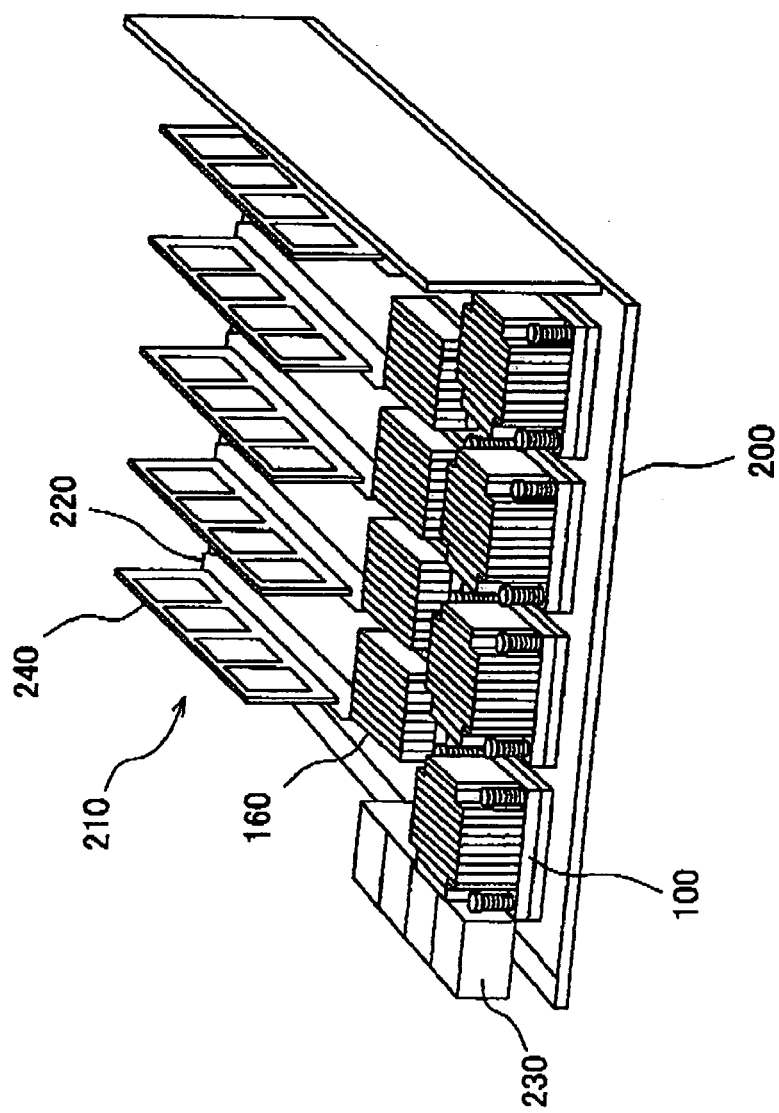
FIG. 2 is a schematic perspective view of all internal structure of the electronic apparatus shown in FIG. 1.

Referring now to accompanying drawings, a description will be given of a package module 100 as a package structure of one embodiment according to the present invention, a printed circuit board 200 mounted with the package module, and an electronic apparatus 300 that includes the printed circuit board 200. Here, FIG. 1 is a schematic perspective view of the electronic apparatus 300. FIG. 2 is a perspective overview of a system board as the printed circuit board 200 included in the electronic apparatus 300. In the following description, a reference numeral with no alphabetical capital generalizes any reference numeral with an alphabetical capital.

As shown in FIG. 1, the electronic apparatus 300 of the instant embodiment is exemplarily, implemented as a rack mount type UNIX server. The electronic apparatus 300 is screwed onto a rack (not shown) by a pair of attachment parts 302, and includes the printed circuit board 200 shown in FIG. 2 in a housing 310.

The housing 310 is provided with a fan module 320, which rotates a built-in cooling fan to generate airflow and compulsorily cools cooling fins 164A of a heat sink 160A, which will be described later. The fan module 320 has a power section (not shown), and a propeller section (not shown) fixed onto the power section. The power section may use any structure known in the art, which typically includes a rotary shaft, a bearing around the rotary shaft, a bearing house, a magnet for a motor, etc., and a detailed description thereof will be omitted. The propeller section includes a number of angled, isogonally or non-isogonally arranged rotors, which have a predetermined size. The power section and the propeller section may or may not be separable.

As shown in FIG. 2, the printed circuit board 200 includes a package module 100, an LSI module 210 around the package module, a plurality of block plates 220 for receiving a plurality of memory cards 240, and a connector 230 for an external device, such as a hard disc and a LAN. As shown in FIG. 4, which will be described later, the printed circuit board 200 includes perforations 202, and fixes a bolster plate 250 on the bottom surface of the printed circuit board 200.

Figure 3A:
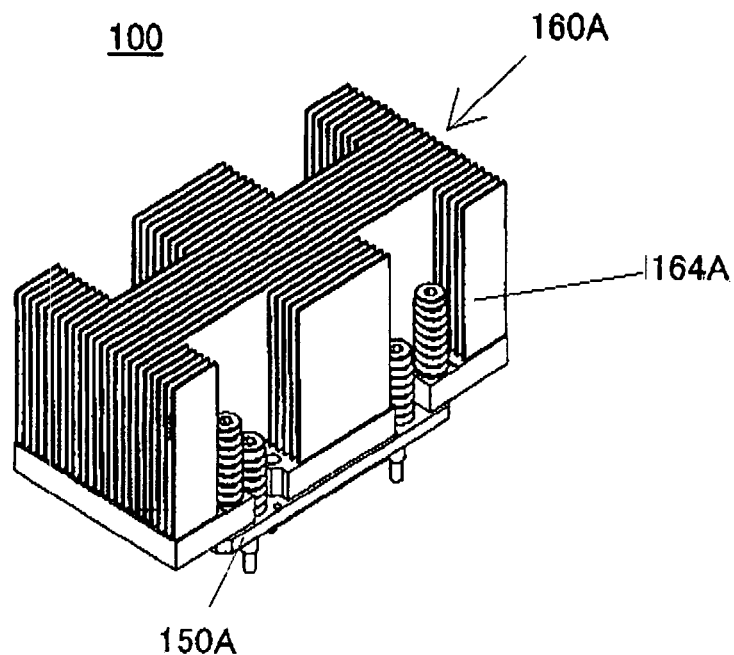
FIGS. 3A and 3B are schematic perspective views of a package module shown in FIG. 2.
Figure 3B:
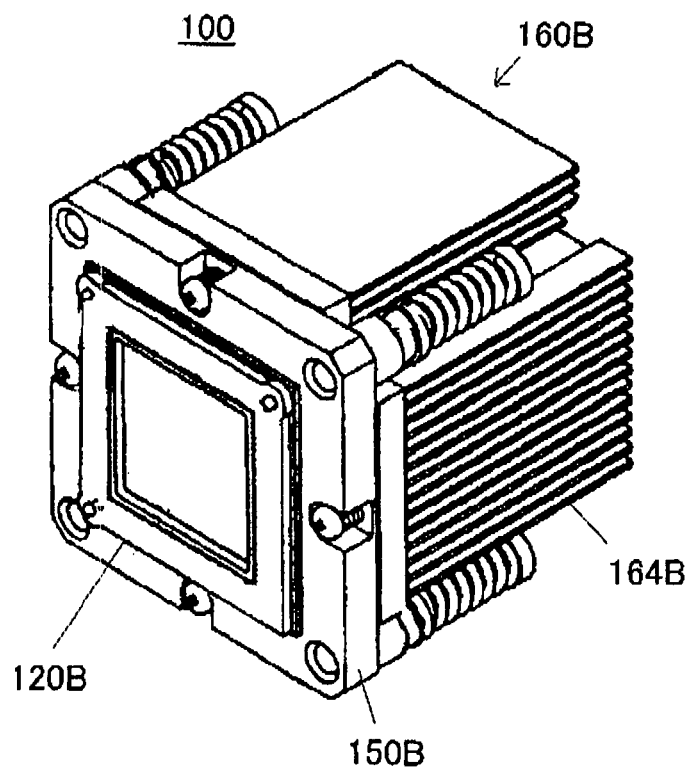
Figure 4A:
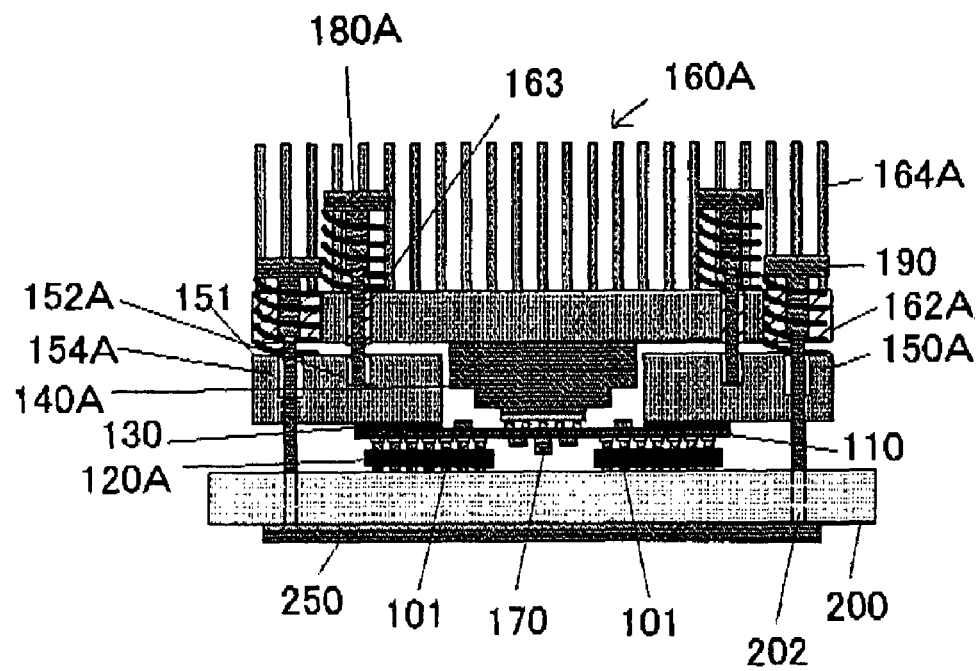
FIGS. 4A and 4B are schematic sectional views of a package module shown in FIG. 2.
Figure 4B:
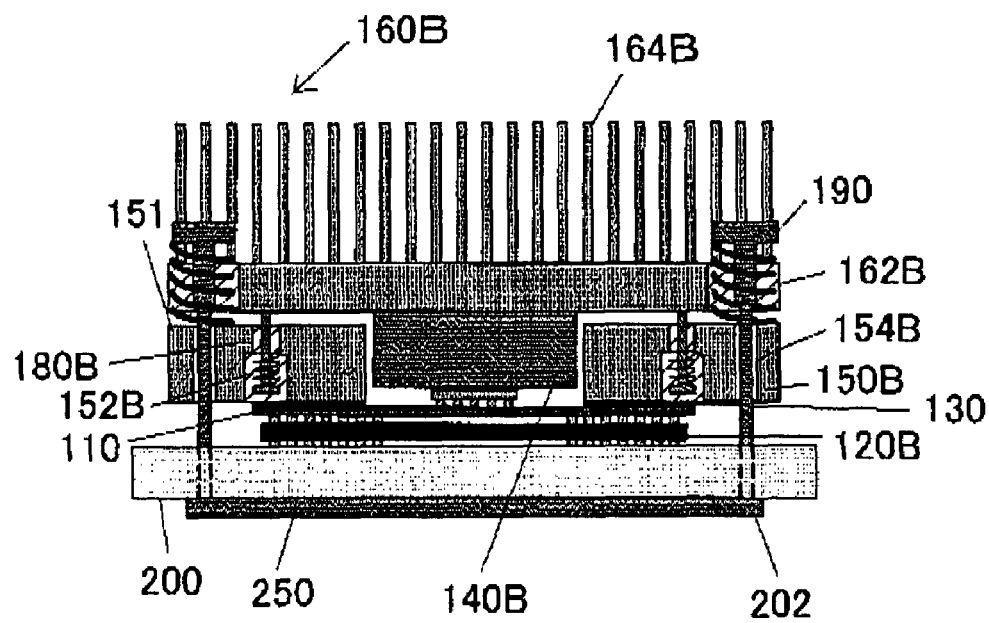

The package module 100 serves as a LGA package that is mounted with an LSI 102 and connected to the printed circuit board 200 via an LGA socket 120. More specifically, the package module 100 includes an LGA socket 120, an adhesive sheet 130, a heat spreader 140, a stiffener 150, a heat sink 160, a first pressure mechanism 180, and a second pressure mechanism 190. Here, FIG. 3A is a schematic perspective view of the package module 100, and FIG. 3B is its variation. FIG. 4A is a schematic sectional view of the package module, corresponding to a perspective view of FIG. 3A, and FIG. 4B is a schematic sectional view of its variation, corresponding to a perspective view of FIG. 3B.

The package board 110 is made of resin having a thickness of about 1 mm. Advantageously, the resin board is thinner than a ceramic board with a thickness of about 2 mm to 3 mm, and thus superior in electric characteristic to, less expensive than, and more easily processed than the ceramic board.

The package board 110 is mounted with the LSI 102 that serves as a CPU on its top, and the LGA socket 120 on its bottom. While the package board 110 of the instant embodiment is a single chip type mounted with one LSI 102, the present invention does not exclude a multi-chip type package board. Since the LSI 102 has a thickness of about 500 μm, while underfill 106, which will be described later, has a thickness of about 100 μm, a difference in coefficient of thermal expansion between the package board 110 and the LSI 102 prevails over a difference in coefficient of thermal expansion between the package board 110 aid the underfill 106.

Figure 6:
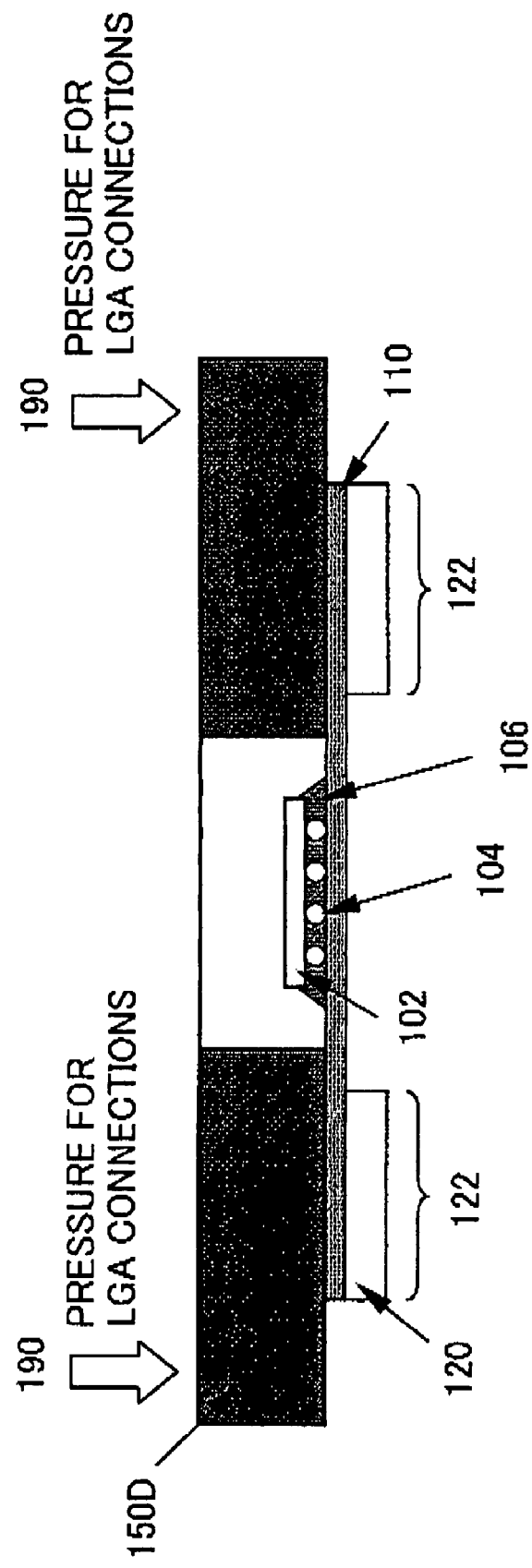
FIG. 6 is a schematic sectional view showing another relationship between a stiffener and LGA socket in the package module shown in FIG. 2.

As shown in FIGS. 5 and 6, which will be described later, the LSI 102 is an exoergic circuit element soldered onto the package board 110 by bumps 104 as terminals, and the resin underfill 106 that is usually used for a flip chip (or a chip that has bumps) is filled between the LSI 102 and the package board 110 to seal the bumps 104 and maintain connection reliability. Here, FIG. 5 is a schematic sectional view showing a relationship between the stiffener 150 and the LGA socket, while FIG. 6 is its variation. FIGS. 2 to 4 may use the structure shown in FIG. 5 or FIG. 6.

The second pressure mechanism 190, which will be described later, applies the pressure to the LGA socket 120, and firmly connects the LGA socket 120 to the printed circuit board 200. Unlike a BGA package that uses soldering for the printed circuit board 200, a connection using the LGA socket 120 would inexpensively shorten the attachment time, and would not cause thermal breakage of the printed circuit board 200 associated with soldering. The LGA socket 120 may have an approximately hollow square shape like LGA socket 120A shown in FIG. 4A, or an approximately hollow square shape like the LGA socket 120B shown in FIG. 4B. The LGA socket 120A shove in FIG. 4A is mounted with a capacitor or other circuit components 170 in the hollow part. The LGA socket 120 includes, as shown in FIGS. 5 and 6, LGA terminal sections 122 as an actual connection part with the printed circuit board 200.

The adhesion sheet 130 has an approximately rectangular and square shape that follows the external form of the package board 110. The adhesion sheet 130 may prevent a positional offset of the stiffener 150 in carrying the package module 100, etc., increasing handling reliability. The adhesion sheet 130 may be adhesives. It is optional to provide the adhesive sheet 130 or adhesives. The adhesive sheet 130 or adhesives is used when two members to be adhered to each other (which are the package board 110 and the stiffener 150) have close coefficient of thermal expansion. A large difference in thermal expansion would lose an adhesion effect due to bowing.

The heat spreader 140 serves to transmit heat from the LSI 102 to the beat sink 160, and is made of AlN and Cu with a high coefficient of thermal conductivity. The heat spreader 140 may have a convex section like the heat spreader 140A shown in FIG. 4A, or a rectangular parallelepiped shape with an approximately square bottom surface that joints with the LSI 102 like the heat spreader 140B shown in FIG. 4B. A connection of the LSI 102 to the sectionally concave part would enlarge a distance from the heat spreader 140A around the LSI 102 on the package board 110, enabling other high circuit element 101 to be arranged, and increasing the packaging density. Thermal grease or thermal sheet with a high coefficient of thermal conductivity is filled between the heat spreader 140 and the LSI 102.

Figure 9:
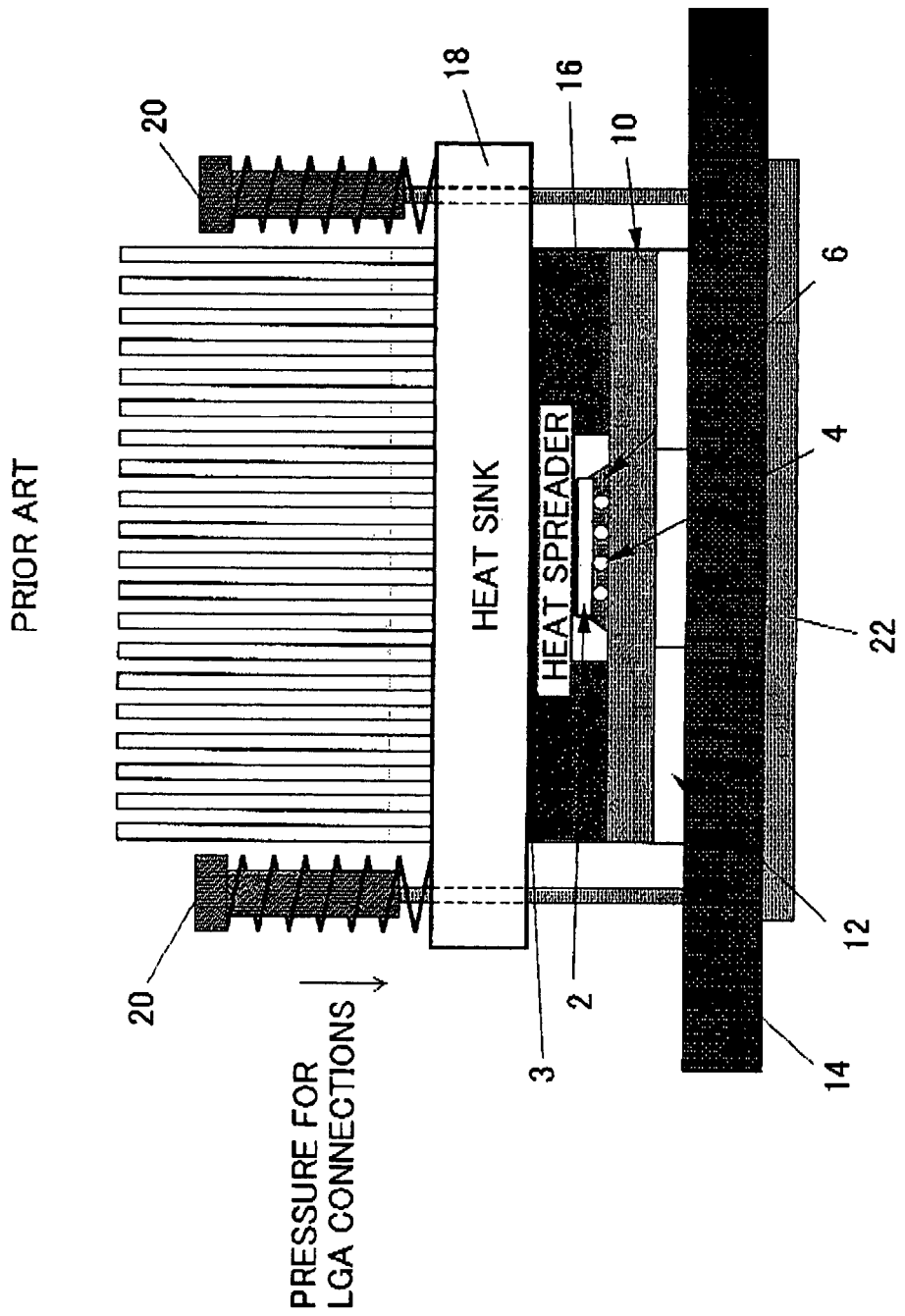
FIG. 9 is a schematic sectional view for explaining fixture of the conventional LGA package including a heat sink.
Figure 10:
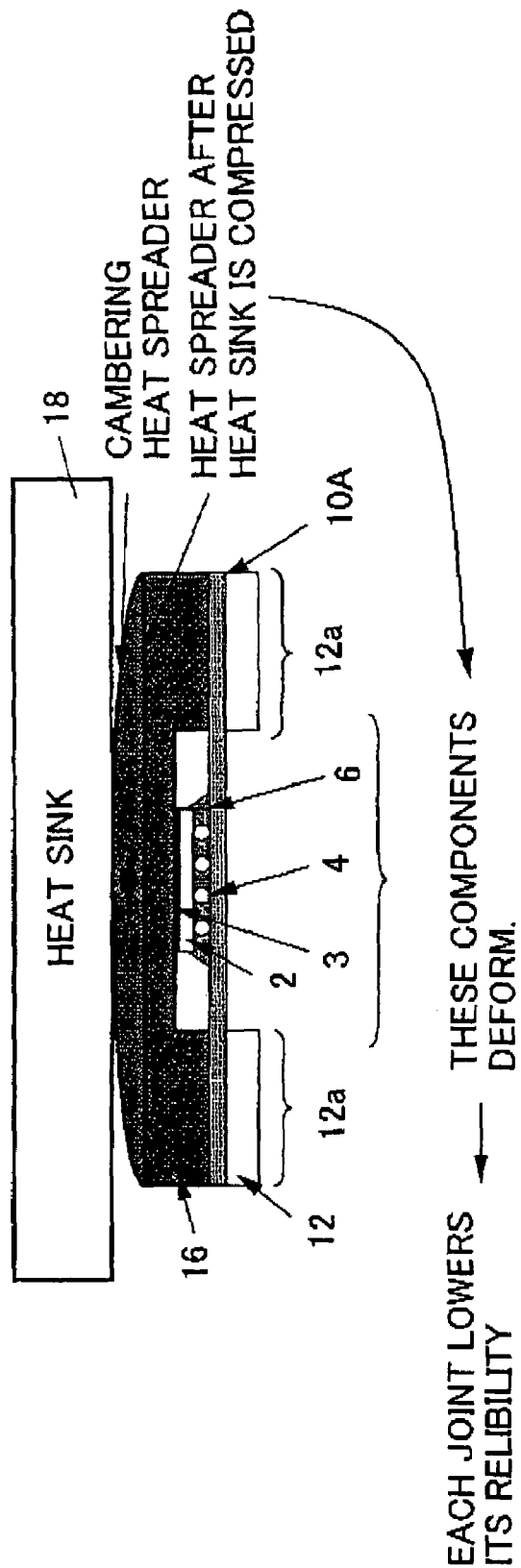
FIG. 10 is a schematic sectional view for explaining a problem of the structure shown in FIG. 9.

Unlike the lid structure shown in FIG. 9, the heat spreader 140 of the instant embodiment is not connected to the package board 110 and prevents a direct application of the force from the heat spreader 140 to the package board 110. In other words, the instant embodiment separates the first and second pressures from each other by eliminating the pressure function of the LGA socket 12 from the heat spreader 140 whereas the conventional heat spreader 16 has this function.

The stiffener 150 is arranged between the heat sink 160 and the package board 110, and adhered to the package board 110 via an adhesive sheet. The external form of the stiffener 150 forms its bottom that is connected to the package board 110, as approximately square hollow part similar to the shape of the package board 110. The hollow bottom has a square shape and accommodates the LSI 102 and heat spreader 140. The stiffener 150 is connected to the first pressure mechanism 180 via holes 152, and the second pressure mechanism 190 via its top 151 and perforations 154.

The package module 100 uses the stiffener 150 to separate pressure by the first pressure mechanism from pressure by the second pressure mechanism. In other words, the package module 100 separates the first pressure to connect the heat sink 160 to the package board 110 from second pressure to compress the LGA socket 120 of the package board 110 against the printed circuit board 200. As a result, the second pressure is prevented from affecting the connection part between the LSI 102 and the package board 110, and the connection part between the LSI 102 and the heat spreader 150, so that these connection parts are protected. The first pressure is about 10 to 15 kgf smaller than the second pressure that is about 70 to 100 kgf in the instant embodiment. The first pressure is set to be about one tenth to about one fifth as high as the second pressure. As shown in FIGS. 4 and 6, the stiffener 150 is larger than the external form of the package board 110. Thereby, the first and second pressure mechanisms may be arranged easily. FIGS. 5 and 6 enlarge a vicinity of the LSI 102, bumps 104, underfills 106, package board 110, and stiffener 150, and omit firs and second pressure mechanisms and other components.

While the stiffener 150 partially covers the connection part between the package board 110 and the printed circuit board 200 as shown in a stiffener 150C shown in FIG. 5, it preferably covers the LGA socket 120 as the connection part between the package board 110 and the printed circuit board 200, in particular, the LGA terminals 122, so as to strengthen the connection of the socket 120 to the printed circuit board 200. Therefore, the stiffener 150 preferably has certain thickness, rigidity and strength. The stiffener 150 is made of a highly rigid material, such as stainless, whereby the stiffener 150 serves to flatten the package board 110. The stiffener 150 is attached between the stiffener 150 and the package board 110 through thermal contact bonding using an adhesion sheet.

The heat sink 160 includes a base 162, and cooling fins 164. The base 162 is a plate composed, for instance, of aluminium, copper, aluminum nitride, artificial diamond, plastic, or other materials of high thermal conductivity, and connected to the heat spreader 140 or the LSI 102. The heat sink 160 is manufactured by sheet metal working, aluminum die casting, or other processes. The housing 120, if made of plastic, may be forced, for example, by injection molding. The cooling fins 164 include, as shown in FIGS. 2 to 4, many aligned plate-shaped fins, and form a convex portion to increase a, surface area thereof, thereby enhancing dissipating effects. However, the shape of the fin 162 is not limited to one like a plate, and any arrangement shapes like a pin, a curve, etc. may be adopted. The fins 142 do not necessarily have to be aligned horizontally at a regular interval, but may be placed radially or obliquely with respect to the base 162. Moreover, the number of the fins 162 may be set arbitrarily. The fins 162 are preferably made of a material of high thermal conductivity, such as aluminum, copper, aluminum nitride, artificial diamond, and plastic. The fins 162 are formed by molding, a press fit, brazing, welding, injection molding, or the like.

Figure 7:
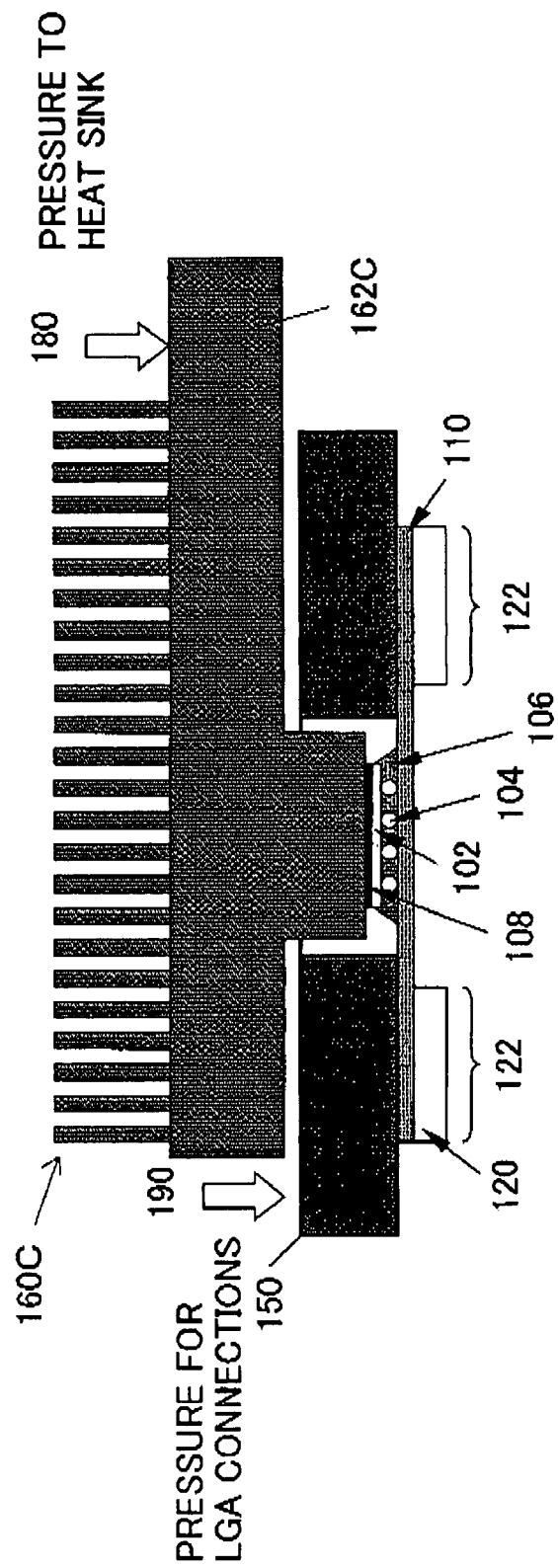
FIG. 7 is a schematic sectional view of the package module including a variation of the heat sink shown in FIG. 2
Figure 8:
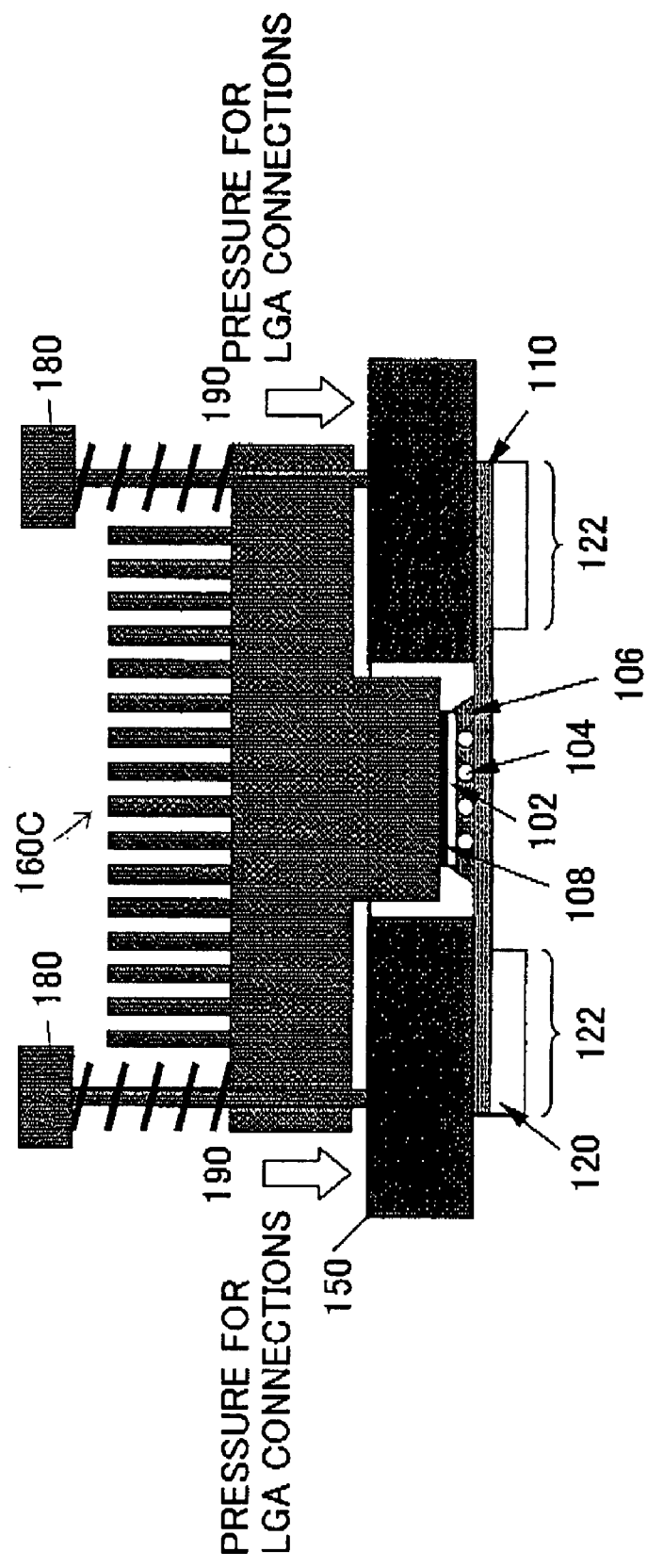
FIG. 8 is another schematic sectional view of the package module including the beat sink shown in FIG. 7.

The heat sink 160 may be replaced with a heat sink 160C shown in FIG. 7. Here, FIG. 7 is a schematic sectional view for explaining a variation of the heat sink shown in FIG. 4. The heat sink 160C includes a base 162C having a convex section connected to the LSI 102. The heat sink 160C is connected to the LSI 102 directly (through thermal grease 108 though). A connection of the heat sink 160C to the LSI 102 reduces more interfaces than a connection to the LSI 102 via the heat spreader 140. The number of interfaces is two in the structure shown in FIG. 4 since the interfaces exist between the LSI 102 and the heat spreader 140 and between the heat spreader 140 and the heat sink 160. On the other hand, the number of interfaces in FIG. 7 is one between the LSI 102 and the heat sink 160C. The interface causes a loss of thermal conduction; the reduced number of interfaces decreases the heat loss at the interface and improves the heat radiation efficiency. While the structure shown in FIG. 7 uses a positional relationship between the stiffener 150D and the LGA socket 120 shown in FIG. 6, it may use a positional relationship between the stiffener 150C and the LGA socket 120 shown in FIG. 5. FIG. 8 is a schematic sectional view of the first pressure mechanism 180 that presses the heat silk 160C against the stiffener 150.

Referring to FIG. 4, the first pressure mechanism 180 serves to compress one of the heat sink 160 and the stiffener 150 against the other, and exemplarily includes four spring clamp bolts in the instant embodiment. The first pressure mechanism 180 may press the heat sink 160 against the stiffener 150 through the top of the heat sink 160, like the first pressure mechanism 180A shown in FIG. 4A, or press the stiffener against the heat sink 160 via sectionally convex holes 152B provided in the stiffener 150, like the first pressure mechanism 180B shown in FIG. 4B. The structure shown in FIG. 4B is preferable to maintain the heat radiation efficiency of the heat sink 160 since it does not reduce the area of the fins 164 of the heat sink 160. The hole 152 projects from the package board 110 to the front in FIG. 4B, and the spring clamp bolt is detachable from the first pressure mechanism even after the stiffener 150 is attached to the printed circuit board 200.

In FIG. 4A, the first pressure mechanism 180 is engaged with the non-perforating holes 152A in the stiffener 150 through perforations 163 provided in the base 162 of the heat sink 160. The holes 152A has a positioning function, but it is optional to provide the holes 152A because the top 151 of the stiffener 150 may be used as shown in FIG. 8. In FIG. 4B, the first pressure mechanism 180 is engaged with the bottom of the heat sink 160 through the holes 152B.

The second pressure mechanism 190 serves to compress the stiffener 150 against the printed circuit board 200, and exemplarily includes four spring clamp bolts in the instant embodiment. The spring clamp bolt of the second pressure mechanism 190 compresses the stiffener 150 against the printed circuit board 200 from the top of the stiffener 150, and is fixed onto the bolster plate 250 via the perforations 154 in the stiffener 150 and the perforations 202 provided in the printed circuit board 200. The bolster plate 250 is made of firm stainless having a thickness of about 3 mm in the instant embodiment to maintain the strength and flatness of the printed circuit board 200.

The stiffener 150, first pressure mechanism 180, and second pressure mechanism 190 serve as a fixture component in the inventive package structure.

In attaching the heat sink 160, the thermal grease or compound is radially applied onto a surface of the beat sink 160 at the side of the heat spreader 140. Then, the applied surface of the heat sink 160 is placed on the heat spreader 140. Next, spring clamp bolts of the first and second pressure mechanisms 180 and 190 are fixed using a torque driver.

The package structure shown in FIG. 4 uses two independent members for first and second pressure mechanism 180 mid 190, and thus may require a large installation space, the increased number of components, and complex component processing. A description will be given of several variations of the pressure mechanisms 180 and 190 shown in FIG. 4, with reference to FIGS. 11 to 14. Here, FIGS. 11 to 14 are schematic partial sectional views of variations of the pressure mechanisms 180 and 190 shown in FIG. 4. The embodiment shown in FIGS. 11 to 14 is characterized in dividing applied load using a mechanism at one point.

Figure 11:
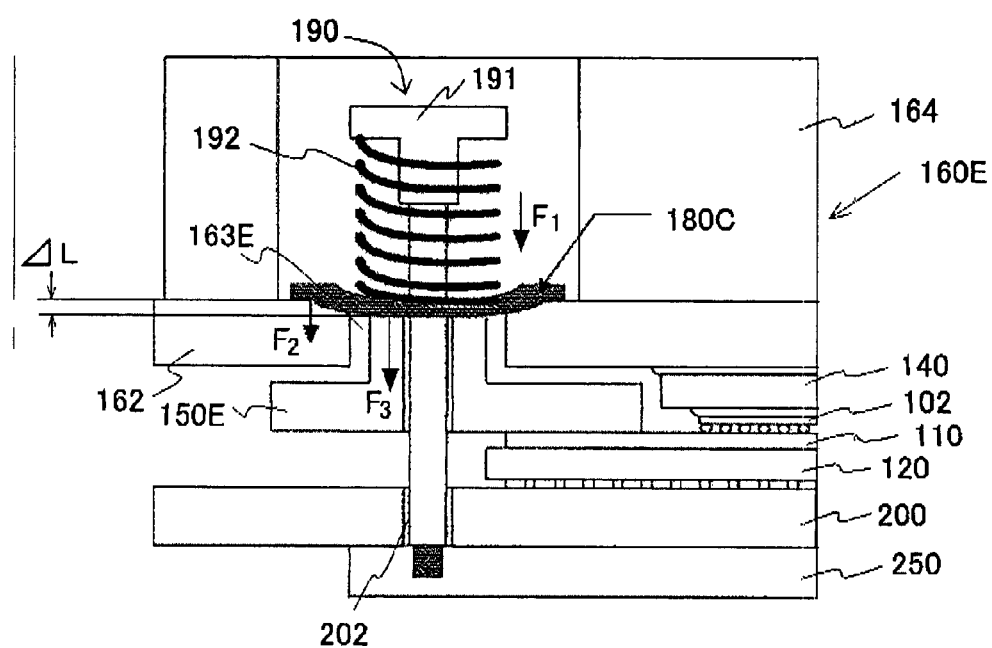
FIG. 11 is a schematic partial view of a variation of a pressure mechanism shown in FIG. 4.

Referring to FIG. 11, the pressure mechanism includes a flat spring as a first pressure mechanism 180C, and a spring clamp bolt as a second pressure mechanism 190 that perforates the flat spring 180C. The spring 192 of the spring clamp bolt 190 is arranged on the flat spring 180C and compresses the flat spring 180C. As a result bolt part 191 of the spring clamp bolt 190 couples the flat spring 180C to a coil spring 192. As a result, in comparison with the structure shown in FIG. 4, the bolt part 191 that is commonly used for two spring members for multifunctional purposes miniaturizes the device. The flat spring 180C has a center part that faces a hole 163 in the base 162 of the heat sink 160, and a peripheral arranged on the base 162.

A stiffener 150E receives force $F_3=F_1-F_2$ and the printed circuit board 200 receives the force $F_1$, and the heat sink 160E and the LSI 102 receive the force $F_2$ where $F_1$ is a spring force of the spring 192 of the spring clamp bolt 190, and $F_2$ is a spring force of the flat spring 180C. In order to transmit the force $F_1-F_2$ to the stiffener 150E, the stiffener 150E has a concave that protrudes into a hole 163E in the base 162. Therefore, a diameter of the hole 163E is larger than that of the hole 163 shown in FIG. 4A.

Thus, the structure shown in FIG. 11 may apply part of the spring force $F_1$ of the spring 192 of the spring clamp bolt 190 to the LSI 102, and exhibit the same effects as those shown in FIG. 4. As the pressure mechanisms 180C and 190 may be provided at one position, the heat sink 160E may maintain the heat radiation efficiency without reducing the area for the fins 164 and. The bolt part 191 of the bolt 190 is connected to springs 180F and 192, and provides a simpler and smaller structure than use of two types of spring clamp bolts.

Figure 12:
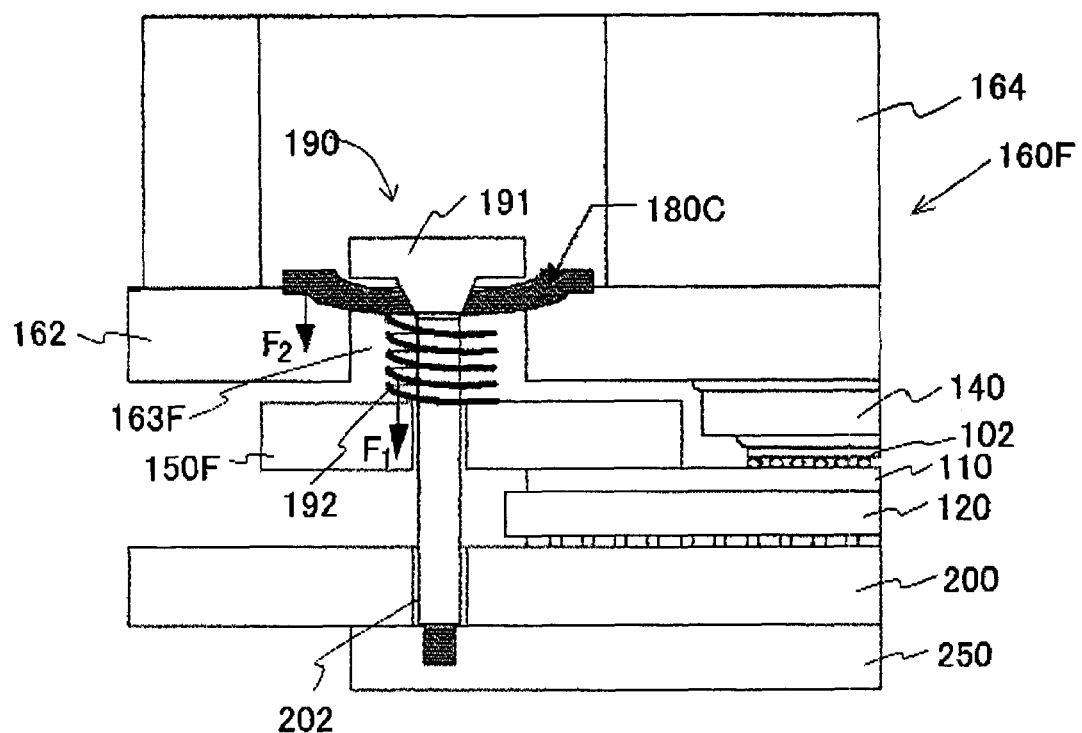
FIG. 12 is another schematic partial view of a variation of a pressure mechanism shown in FIG. 4.

Referring to FIG. 12, the pressure mechanism includes the flat spring as a first pressure mechanism 180C, and the spring clamp bolt as a second pressure mechanism 190 that perforates the flat spring 180C, but is different from the structure shown in FIG. 11 in that the spring 192 of the spring clamp bolt 190 is located under the flat spring 180C. The spring 192 of the spring clamp bolt 190 is accommodated in a hole 163F provided in the base 162, and compresses the stiffener 150F structurally similar to the stiffener 150 shown in FIG. 8. As a result, a bolt part 191 of the spring clamp bolt 190 couples the flat spring 180C to a coil spring 192. As a result, in comparison with the structure shown in FIG. 4, the bolt part 191 commonly used for two spring members for multifunctional purposes and miniaturizes the device. The flat spring 180C has a center earth that faces a hole 163 in the base 162 of the heat sink 160, and a peripheral arranged on the base 162.

A stiffener 150F receives force $F_1$ and the printed circuit board 200 receives the force $(F_1+F_2)$, and the heat sink 160E and the LSI 102 receive the force $F_2$ where $F_1$ is a spring force of the spring 192 of the spring clamp bolt 190, and $F_2$ is a spring force of the flat spring 180C. A diameter of the hole 163F is larger than that of the hole 163 shown in FIG. 4A.

Thus, the structure shown in FIG. 12 may apply only the spring force of the flat spring 180C to the LSI 102, and exhibit the same effect as shown in FIG. 4. As the pressure mechanisms 180C and 190 may be preferably provided at one position, the heat sink 160F does not reduce the area for the fins 164 and maintains the heat radiation efficiency. The bolt part 191 of the bolt 190 is connected to springs 180C and 192, and provides a simpler and smaller structure that use of two types of spring clamp bolts.

Figure 13:
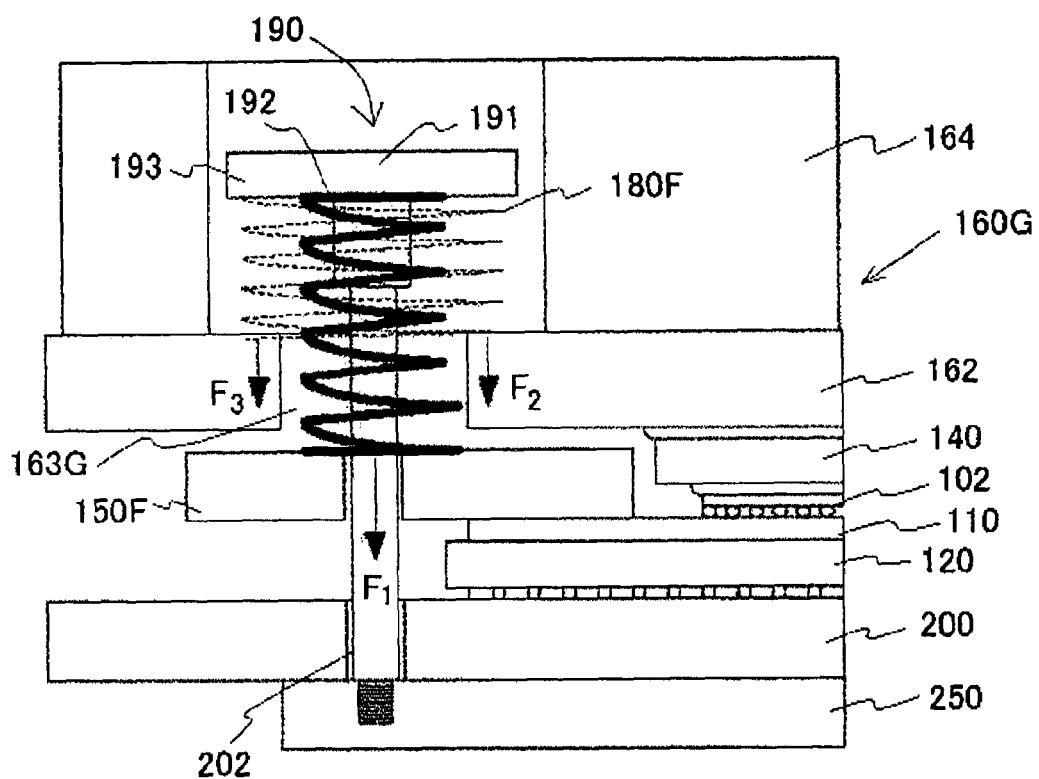
FIG. 13 is still another schematic partial view of a variation of a pressure mechanism shown in FIG. 4.
Figure 14:
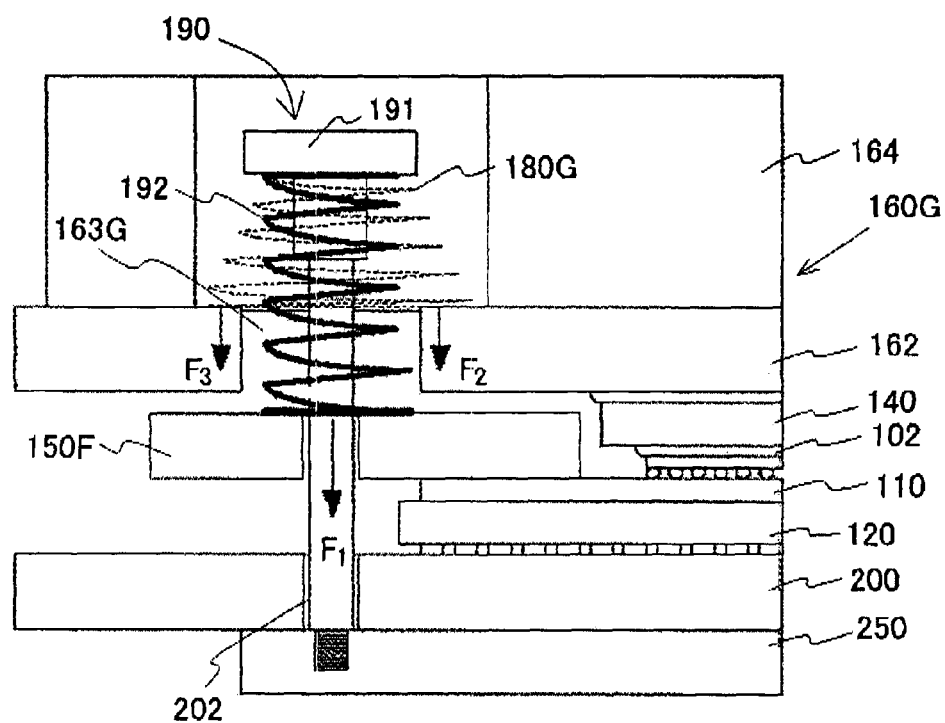
FIG. 14 is another schematic partial view of a variation of a pressure mechanism shown in FIG. 4.

Referring to FIG. 13, the pressure mechanism includes a flat spring as a first pressure mechanism 180F, and the spring clamp bolt as a second pressure mechanism 190 that perforates the flat spring 180F. The spring 192 of the spring clamp bolt 190 and the coil spring 180F form a coil double spring. Thus, the instant embodiment uses a coil spring instead of the flat spring 180C. The present invention does not limit a coil spring shape applicable to the first pressure mechanism 180, and the coil spring 180F may be replaced with a coil spring 180G shown in FIG. 14, for example. The coil spring 180G has an approximately cone shape and is different from the coil spring 180F that has an approximately cylindrical shape.

The coil spring spring 192 of the spring clamp bolt 190 is accommodated in the bole 163F provided in the base 162, and compresses the stiffener 150F. The coil spring 180F or 180G is located between the bolt head 193 of the bolt 190 and the base 162 of the heat sink 160. As a result, the bolt part 191 of the spring clamp bolt 190 couples the flat spring 180F or 180G to a coil spring 192. As a result, in comparison with the structure shown in FIG. 4, the bolt part 191 commonly used for two spring members for multifunctional purposes and miniaturizes the device. The flat spring 180C has a center part that faces a hole 163 in the base 162 of the heat sink 160, and a peripheral arranged on the base 162.

A stiffener 150F receives force $F_1$ and the printed circuit board 200 receives the force $(F_1+F_2)$, and the heat sink 160 receives the force $F_2$ where $F_1$ is a spring force of the spring 192 of the spring clamp bolt 190, and $F_2$ is a spring force of the flat spring 180C. A diameter of the hole 163G is larger than that of the hole 163 shown in FIG. 4A. Thus, the structure shown in FIG. 13 or 14 may apply only the spring force of the coil spring 180F or 180G to the LSI 102, and exhibit the same effect as shown in FIG. 4. As the pressure mechanisms 180F or 180G and 190 may be preferably provided at one position, the heat sink 160G does not reduce the area for the fins 164 and maintains the heat radiation efficiency. The bolt part 191 of the bolt 190 connects the spring 180F or 180G to the spring 192, and provides a simpler and smaller structure that use of two types of spring clamp bolts.

In operation, the electronic apparatus 300 uses inexpensive resin package board 110, which is so thin that it may provide good electric characteristic having less noises. The second pressure mechanism 190 successfully connects the LGA socket 120 to the printed circuit board 200. The stiffener 130 prevents the pressure by the second pressure mechanism from being applied to the LSI 102, and maintains the stable operation of the LSI 102. The first pressure mechanism 180 applies proper pressure and maintains a thermal connection between the heat sink 160 and the LSI 102, and thus the heat sink 160 properly radiates the heat from the LSI 102. The cooling fins 164 of the heat sink 160 are cooled by the cooling fan in the fan module 320.

Further, the present invention is not limited to these preferred embodiments, and various modifications and changes may be made in the present invention without departing from the spirit and scope thereof. For example, the inventive electronic apparatus is not limited to a rack mount type server, but is applicable to a book shelf type. It is not limited to a server, and is applicable to a personal computer, a network device, a PDA, and other peripherals. The inventive package module 100 is applicable to an exoergic circuit element that does not serve as a CPU, such as a chip set. The present invention may use a solenoid for pressurizing means of the pressure mechanisms 180 and 190, and is not limited to a spring. Even when the spring is used, its shape, size and type are not limited.

The inventive package structure, a printed circuit board having the same, and an electronic apparatus having the same prevent the second pressure from being applied to the connection part between the exoergic part and the package board and the connection part between the exoergic part and the heat sink, protecting these connection parts from pressure breakage and maintaining reliability.

What is claimed is:

1. A package structure to be mounted on an external printed circuit board, said package structure comprising:
    a package board that is mounted with an exoergic circuit element;
    a heat sink that radiates heat from the exoergic circuit element;
    a first pressure mechanism that applies a first pressure for operatively connecting the heat sink to the package board; and
    a second pressure mechanism that applies a second pressure for operatively connecting the package board to the printed circuit board, said second pressure mechanism being separate from said first pressure mechanism and an application of the first pressure by said first pressure mechanism being independent of an application of the second pressure by said second pressure mechanism.

2. A package structure according to claim 1, wherein the first pressure is less than the second pressure.

3. A package structure according to claim 1, further comprising a socket, provided on said package board, which electrically connects said package structure to the printed circuit board.

4. A package structure according to claim 1, wherein said package board is made of resin.

5. A package structure to be mounted on an external printed circuit board, said package structure comprising:
    a package board that is mounted with an exoergic circuit element;
    a heat sink that radiates heat from the exoergic circuit element, wherein first pressure for connecting the heat sink to the package board is separated from second pressure for compressing the package board against the printed circuit board; and
    a heat spreader that thermally connects the heat sink to the exoergic circuit element, and has a convex section.

6. A package structure according to claim 1, further comprising a heat spreader that thermally connects the heat sink to the exoergic circuit element, and is not connected with the package board.

7. A package structure according to claim 1, wherein said heat sink is connected to the exoergic circuit element.

8. A package structure to be mounted onto an external printed circuit board, said package structure comprising:
    a package board that is mounted with an exoergic circuit element;
    a heat sink that radiates heat from the exoergic circuit element;
    a stiffener located between the heat sink and the package board around the exoergic circuit element;
    a first pressure mechanism that applies a first pressure for operatively connecting one of the heat sink and the stiffener to the other; and
    a second pressure mechanism that applies a second pressure for operatively connecting the stiffener to the printed circuit board, said second pressure mechanism being separate from said first pressure mechanism and an application of the first pressure by said first pressure mechanism being independent of an application of the second pressure by said second pressure mechanism.

9. A package structure according to claim 8, further comprising a socket, provided on the package board, which connects the package structure with the printed circuit board electrically.

10. A package structure according to claim 8, wherein the package board is made of resin.

11. A package structure according to claim 8, wherein the stiffener is larger than an external form of the package board.

12. A package structure according to claim 8, wherein said heat sink is connected to the exoergic circuit element.

13. A package structure to be mounted onto an external printed circuit board, said package structure comprising:
    a package board that is mounted with an exoergic circuit element;
    a heat sink that radiates heat from the exoergic circuit element;
    a stiffener located between the heat sink and the package board around the exoergic circuit element;
    a first pressure mechanism that presses one of the heat sink and the stiffener against the other;
    a second pressure mechanism that compresses the stiffener against the printed circuit board; and
    a heat spreader that thermally connects the heat sink with the exoergic circuit element, and has a convex section.

14. A package structure according to claim 8, further comprising a heat spreader that thermally connects the heat sink with the exoergic circuit element, and is not connected with the package board.

15. A package structure to be mounted onto an external printed circuit board, said package structure comprising:
    a package board that is mounted with an exoergic circuit element;
    a heat sink that radiates heat from the exoergic circuit element;
    a stiffener located between the heat sink and the package board around the exoergic circuit element and adhered to the package board;
    a first pressure mechanism that presses one of the heat sink and the stiffener against the other; and
    a second pressure mechanism that compresses the stiffener against the printed circuit board.

* * * * *